(12) United States Patent
Zhao (10) Patent No.: US 12,010,806 B2
(45) Date of Patent: Jun. 11, 2024

(54) SCREEN PROTECTION ASSEMBLY AND ELECTRONIC DEVICE

(71) Applicant: Zhijun Zhao, Guangzhou (CN)

(72) Inventor: Zhijun Zhao, Guangzhou (CN)

(*) Notice: Subject to any disclaimer, the term of this patent is extended or adjusted under 35 U.S.C. 154(b) by 0 days.

(21) Appl. No.: 18/501,541

(22) Filed: Nov. 3, 2023

(65) Prior Publication Data
US 2024/0155794 A1    May 9, 2024

(51) Int. Cl.
*H05K 5/03*      (2006.01)
*G04G 17/08*     (2006.01)

(52) U.S. Cl.
CPC .............. *H05K 5/03* (2013.01); *G04G 17/08* (2013.01)

(58) Field of Classification Search
None
See application file for complete search history.

(56) References Cited

U.S. PATENT DOCUMENTS

| | | | | |
|---|---|---|---|---|
| 8,427,598 B2* | 4/2013 | Horie | ...................... | G06F 3/041 345/173 |
| 8,934,227 B2* | 1/2015 | Cheon | .................. | H05K 7/1427 348/789 |
| 9,785,186 B2* | 10/2017 | Gregg | .................... | G06F 1/1601 |
| 10,353,432 B2* | 7/2019 | Mathew | ................ | G06F 1/1601 |
| 10,528,086 B2* | 1/2020 | Chung | .................. | G04B 37/08 |
| 10,542,628 B2* | 1/2020 | Prest | ..................... | H05K 5/0217 |
| 2007/0049365 A1* | 3/2007 | Norris | ..................... | G08B 5/223 455/575.8 |
| 2007/0222912 A1* | 9/2007 | Sato | .................. | G02F 1/133528 349/58 |
| 2011/0067799 A1* | 3/2011 | Mussig | ...................... | C09J 7/38 156/324 |
| 2011/0235364 A1* | 9/2011 | Lo | ......................... | G06F 1/1643 445/24 |
| 2012/0212890 A1* | 8/2012 | Hoshino | ............. | H04M 1/0266 361/679.01 |
| 2013/0088818 A1* | 4/2013 | Yamaguchi | ................ | C09J 7/30 361/679.01 |
| 2016/0254587 A1* | 9/2016 | Jung | ........................ | H01Q 7/00 343/702 |
| 2018/0184534 A1* | 6/2018 | Na | .......................... | F16M 11/16 |
| 2020/0053895 A1* | 2/2020 | Kim | ....................... | H10K 50/841 |
| 2020/0124702 A1* | 4/2020 | Fukui | ....................... | H01Q 1/42 |
| 2022/0261039 A1* | 8/2022 | Zhang | ................... | G06F 3/0412 |
| 2022/0336770 A1* | 10/2022 | Ki | ........................ | C08G 18/6229 |

\* cited by examiner

*Primary Examiner* — Xanthia C Relford (57) ABSTRACT

The present disclosure provides a screen protection assembly including: a protective frame, including a top wall and a side wall; a protective film, including a body layer and a double-sided adhesive layer; and an annular adhesive, disposed on an inner side of the top wall and on a periphery of the double-sided adhesive layer; wherein the annular adhesive is bonded to and fixed to the inner side of the top wall and an inner side of the edge portion of the body layer; a thickness of the annular adhesive is less than a thickness of the double-sided adhesive layer, and a thickness difference between the annular adhesive and the double-sided adhesive layer is greater than or equal to a height difference between a front side of a display screen and a front side of a bezel of a main body of a corresponding electronic device.

20 Claims, 6 Drawing Sheets

FIG. 9

SCREEN PROTECTION ASSEMBLY AND ELECTRONIC DEVICE

CROSS REFERENCE

The present disclosure claims priority of Chinese Patent Application No. 202222959329.3, filed on Nov. 4, 2022, the entire contents of which are hereby incorporated by reference in their entirety.

TECHNICAL FIELD

The present disclosure relates to technical field of screen protection for electronic devices, especially relates to a screen protection assembly and an electronic device.

BACKGROUND

A display screen of an electronic device is usually required to be protected by a film. In order to simplify the film application operation, the related art proposes a film applicator with a protective film, which includes a positioning frame, an outer release film, the protective film, and an inner release film. The protective film is arranged in an area limited by the positioning frame; the size of the protective film is adapted to the size of the display screen; the outer release film is bonded and adhered to the protective film and an outer side of the positioning frame; an inner side of the protective film is concave relative to an inner side of the positioning frame, and an exposed part of an inner peripheral surface of the positioning frame transversely abuts against an outer peripheral surface of the electronic device for positioning; the inner release film covers the inner side of the protective film for dust prevention. When the film application is carried out through the film applicator, the inner release film is firstly torn off, and after the protective film is adhered to the display screen, the outer release film is then torn off, and finally the positioning frame is removed, which is not environmentally friendly because this scheme requires the abandonment of the inner release film, the outer release film, and the positioning frame. Further, only the display screen of the electronic device is covered and protected, while a bezel of the electronic device is not protected.

Usually, the display screen of the electronic device protrudes from or is flush with the bezel of the electronic device on a front side. However, some manufacturers have proposed an electronic device in which the display screen is lower than the bezel on the front side, to facilitate the user not to increase the height too much after applying the film. For such an electronic device, Applicant has developed the following two types of screen protection assemblies that protect both the display screen and the bezel of the electronic device.

A type of first screen protection assembly, including a protective frame and a protective film;
  where the protective frame includes a top wall and a side wall extending downwardly from an outer edge of the top wall; the top wall is configured to cover a front side of a bezel of an electronic device, and the side wall is configured to cover an outer peripheral surface of the bezel of the electronic device;
  the protective film includes a body layer and a double-sided adhesive layer having a consistent thickness; the double-sided adhesive layer is bonded and fixed to an inner side of the body layer, and bonded and fixed to an inner side of the top wall to prevent the body layer from detaching from the protective frame.

However, when the film application is carried out through this screen protection assembly, the double-sided adhesive layer is first adhered to the bezel of the electronic device on the front side, such that air is sealed between the double-sided adhesive layer and the display screen of the electronic device. In this way, the double-sided adhesive layer is required to be bonded to the display screen in a curved form and cannot smoothly expel air, which leads to bubbles generated during the film application.

A second type of screen protection assembly has a protective frame that is of the same structure as the protective frame of the first type of screen protection assembly, and the difference is that the second type of screen protection assembly protection film includes a body layer, a dot fixed to an inner side of the body layer for spacing, and an annular double-sided adhesive that is bonded and fixed to the inner side of the body layer and an inner side of the top wall. Although the second type of screen protection assembly can be installed smoothly, an air gap is formed between the body layer and the display screen, thus leading to a problem of touch insensitivity.

SUMMARY OF THE DISCLOSURE

The main purpose of the present disclosure is to propose a screen protection assembly and an electronic device, aimed at solving the technical problems, of a screen protection assembly in the related art, of difficult film application and that the electronic device with a "sinking" front of the display screen cannot be comprehensively protected and has poor touch operation function.

To achieve the above purpose, the present disclosure provides a screen protection assembly, including:
  a protective frame, including a top wall and a side wall extending downwardly from an outer edge of the top wall;
  a protective film, disposed within a window defined by the top wall; wherein the protective film includes a body layer and a double-sided adhesive layer, the double-sided adhesive layer being adhered to, bonded to, and fixed to an inner side of the body layer, and an edge portion of the body layer being exposed to the double-sided adhesive layer; and
  an annular adhesive, disposed on an inner side of the top wall and on a periphery of the double-sided adhesive layer; wherein the annular adhesive is bonded to and fixed to the inner side of the top wall and an inner side of the edge portion of the body layer; a thickness of the annular adhesive is less than a thickness of the double-sided adhesive layer, and a thickness difference between the annular adhesive and the double-sided adhesive layer is greater than or equal to a height difference between a front side of a display screen and a front side of a bezel of a main body of a corresponding electronic device.

In some embodiments, a gap is formed between an outer edge of the double-sided adhesive layer and an inner edge of the annular adhesive.

In some embodiments, the protective film further includes an annular light-shielding layer disposed on the inner side of the edge portion of the body layer and obscuring the gap.

In some embodiments, the annular light-shielding layer is a silkscreen ink.

In some embodiments, the double-sided adhesive layer and/or the annular adhesive cover an inner side of the annular light-shielding layer.

In some embodiments, an edge of the body layer defines a step-shaped recess, and the annular light-shielding layer is disposed on a side of the step-shaped recess facing the display screen of the corresponding electronic device.

In some embodiments, a width of the annular adhesive covered by the top wall is greater than a width of the annular adhesive covered by the body layer.

In some embodiments, the width of the annular adhesive covered by the top wall is greater than or equal to 5 times the width of the annular adhesive covered by the body layer, and a spacing is formed between an outer edge of the annular adhesive and an inner side of the side wall.

The present disclosure further provides an electronic device, including a main body; wherein the main body includes a display screen and a bezel disposed at an edge portion of the display screen; a front side of the display screen is lower than a front side of the bezel; the electronic device further includes the screen protection assembly as above, wherein the double-sided adhesive layer of the screen protection assembly is bonded to the front side of the display screen, and the protective frame of the screen protection assembly covers an outer side of the bezel.

In some embodiments, the main body is a watch host or a mobile phone.

In the screen protection assembly, the protective film and the protective frame are bonded together by the annular adhesive, so as to realize the installation of the two at the same time, and to realize protecting the display screen and the bezel. In the process of applying the film, the protect the film can be fast and accurately installed by virtue of the positioning effect of the protective frame. Since the annular adhesive and the double-sided adhesive layer are independent components, and the thickness of the annular adhesive is less than the thickness of the double-sided adhesive layer, in the process of applying the film, it can be ensured that the double-sided adhesive layer of the protective film is firstly adhered to the display screen, and an exhaust channel is formed between the annular adhesive and the bezel, such that no air bubbles will be generated during the adherence of the protective film and the display screen, thereby ensuring the touch control and aesthetic effect after applying the film.

BRIEF DESCRIPTION OF THE DRAWINGS

In order to more clearly illustrate the technical solutions in the embodiments of the present disclosure, the accompanying drawings to be used in the description of the embodiments will be briefly introduced below, and it is obvious that the accompanying drawings in the following description are only some of the embodiments of the present disclosure, and other accompanying drawings can be obtained according to these drawings for those skilled in the art without giving creative labor.

DETAILED DESCRIPTION

The technical solutions in the embodiments of the present disclosure will be described clearly and completely in the following in conjunction with the accompanying drawings in the embodiments of the present disclosure, and it is obvious that the described embodiments are only a part of the embodiments of the present disclosure and not all of the embodiments. Based on the embodiments in the present disclosure, all other embodiments obtained by those skilled in the art without making creative labor fall within the scope of the present disclosure.

Referring to FIGS. 1 to 5, and FIGS. 7 to 9, in some embodiments, a screen protection assembly 100 is proposed in the present disclosure, including:
- a protective frame 10, including a top wall 12 and a side wall 14 extending downwardly from an outer edge of the top wall 12;
- a protective film 16, disposed within a window defined by the top wall 12; where the protective film 16 includes a body layer 18 and a double-sided adhesive layer 22, the double-sided adhesive layer 22 being adhered to, bonded to, and fixed to an inner side of the body layer 18, and an edge portion of the body layer 18 being exposed to the double-sided adhesive layer 22; and
- an annular adhesive 24, disposed on an inner side of the top wall 12 and on a periphery of the double-sided adhesive layer 22; where the annular adhesive 24 is bonded to and fixed to the inner side of the top wall 12 and an inner side of the edge portion of the body layer 18; a thickness of the annular adhesive 24 is less than a thickness of the double-sided adhesive layer 22, and a thickness difference between the annular adhesive 24 and the double-sided adhesive layer 22 is greater than or equal to a height difference between a front side of a display screen 30 and a front side of a bezel 40 of a main body 200 of the electronic device.

In the embodiments, the protective frame 10 covers the bezel 40 of the main body 200 of the electronic device, such that the bezel 40 can be protected from being bumped or scratched. In order to ensure a certain structural strength to support the protective film 16 and withstand a sufficiently large impact, the protective frame 10 may be made of steel, such as aluminum alloy, stainless steel, titanium alloy, etc. The body layer 18 of the protective film 16 is usually a tempered film, but a film material with other characteristics may alternatively be adopted. It is to be understood that the body layer 18 may be in a single layer, or it may be in multiple layers. For example, the body layer 18 may be a combination of a tempered film and an anti-peep plating layer. The double-sided adhesive layer 22 mainly plays the role of bonding as well as light transmission. It is understood that in actual sales, in order to play a dustproof role for the double-sided adhesive layer 22, the screen protection assembly 100 may further include a release film that is laminated to an inner side of the double-sided adhesive layer 22, and the release film can be torn off when in use. The annular adhesive 24 may be single-sided adhesive or double-sided adhesive.

In the screen protection assembly 100, the protective film 16 and the protective frame 10 are bonded together by the annular adhesive 24, so as to realize the installation of the two at the same time, and to realize protecting the display screen 30 and the bezel 40. In the process of applying the film, the protect the film 16 can be fast and accurately installed by virtue of the positioning effect of the protective frame 10. Since the annular adhesive 24 and the double-sided adhesive layer 22 are independent components, and the thickness of the annular adhesive 24 is less than the thickness of the double-sided adhesive layer 22, in the process of applying the film, it can be ensured that the double-sided adhesive layer 22 of the protective film 16 is firstly adhered to the display screen 30, and an exhaust channel is formed between the annular adhesive 24 and the bezel 40, such that no air bubbles will be generated during the adherence of the protective film 16 and the display screen 30, thereby ensuring the touch control and aesthetic effect after applying the film.

Figure 1:
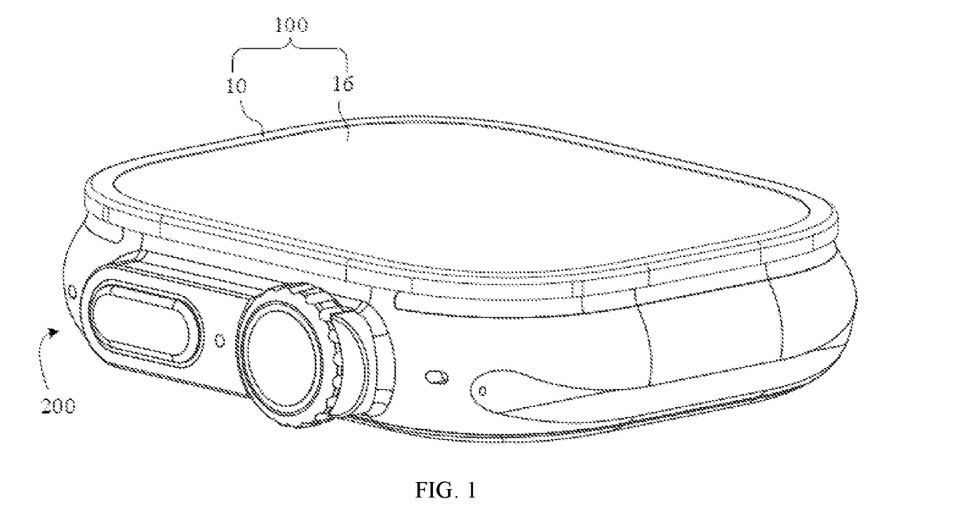
FIG. 1 is a perspective structural schematic view of an electronic device according to an embodiment of the present disclosure, where a main body of the electronic device is a watch host.
Figure 2:
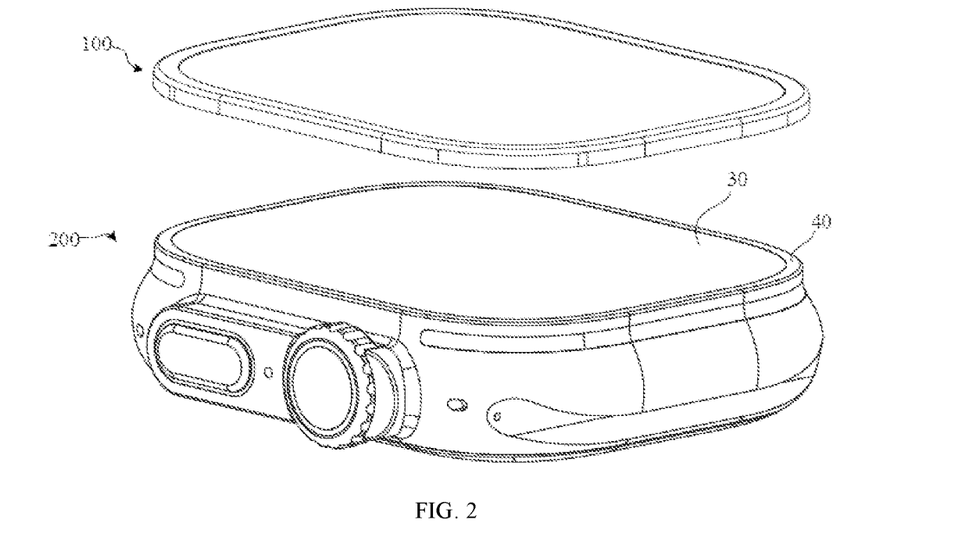
FIG. 2 is a schematic view of an exploded structure of the electronic device in FIG. 1.
Figure 3:
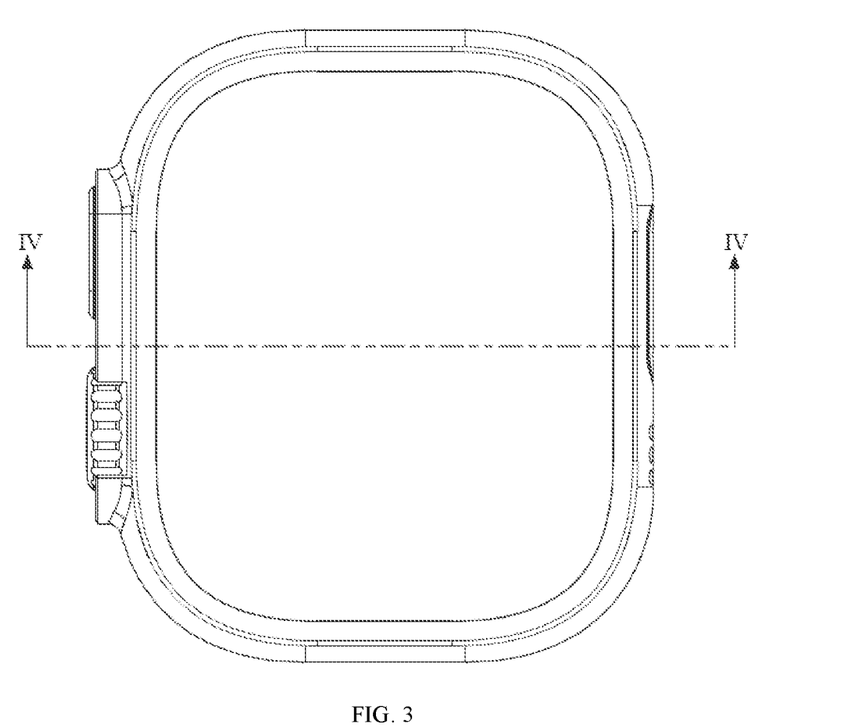
FIG. 3 is a schematic view of a top structure of the electronic device in FIG. 1.
Figure 4:
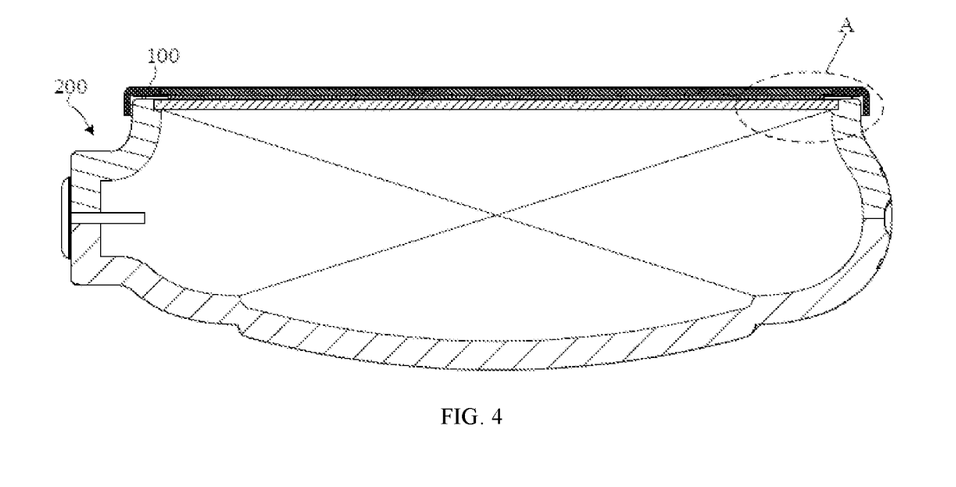
FIG. 4 is a schematic view of a sectional structure along line IV-IV in FIG. 3.
Figure 5:
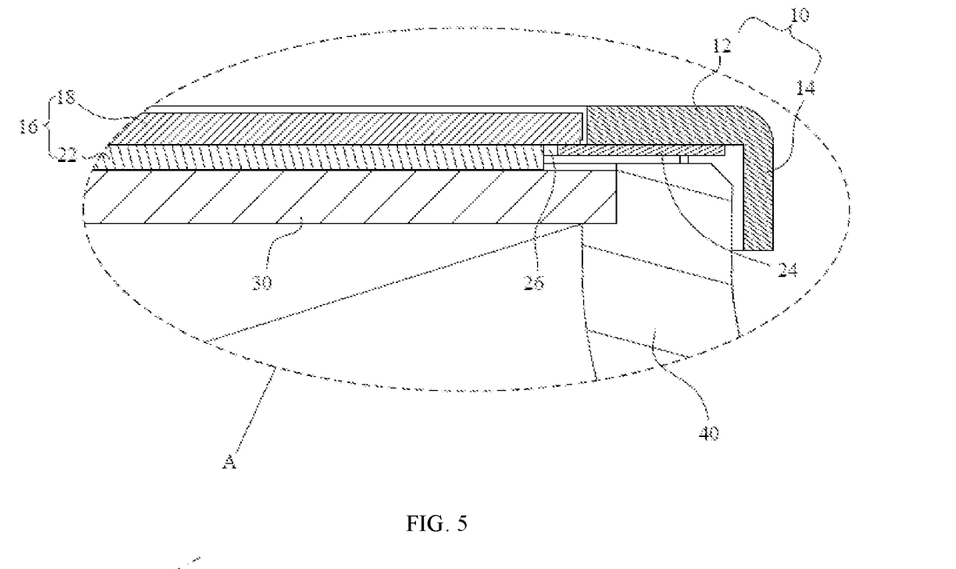
FIG. 5 is a schematic view of a partially enlarged structure at A in FIG. 4.

Further, a gap 26 is formed between an outer edge of the double-sided adhesive layer 22 and an inner edge of the annular adhesive 24, so as to avoid the double-sided adhesive layer 22 and the annular adhesive 24 from forming a superimposed overlap structure, thereby ensuring that the localized deformation of the edge portion of the double-sided adhesive layer 22 or the gap formation between the double-sided adhesive layer 22 and the display screen 30 can be prevented, which improves the quality of the film application and avoids the generation of bubbles on the application surface.

Further, the protective film 16 further includes an annular light-shielding layer (not shown). The annular light-shielding layer is disposed on the inner side of the edge portion of the body layer 18 and obscures the gap 26. In the embodiments, the above design can form a decorative edge on the one hand, and prevent the generation of light difference at the gap 26 on the other hand. In order to facilitate processing, the annular light-shielding layer may be a silkscreen ink.

Further, the double-sided adhesive layer 22 and/or the annular adhesive 24 cover an inner side of the annular light-shielding layer. In this way, there is no need to consider alignment during assembly, thereby simplifying the assembly process and enhancing the assembly efficiency.

Figure 6:
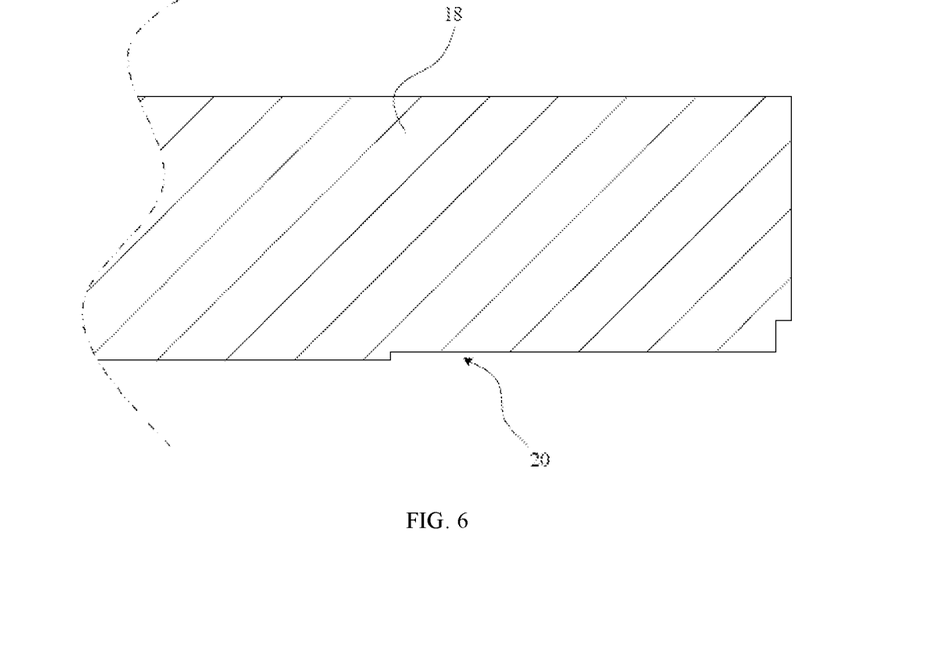
FIG. 6 is a schematic view of a localized structure of an edge portion of a body layer in FIG. 5.
Figure 7:
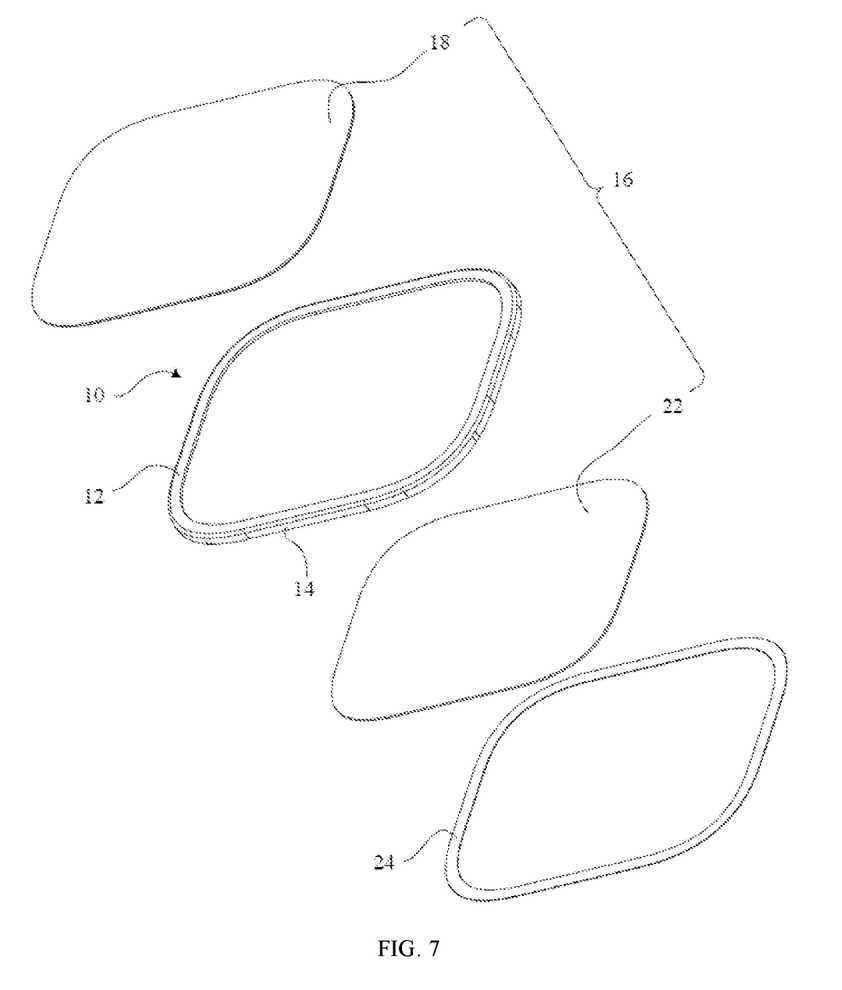
FIG. 7 is a schematic view of an exploded structure of a screen protection assembly in FIG. 2.
Figure 8:
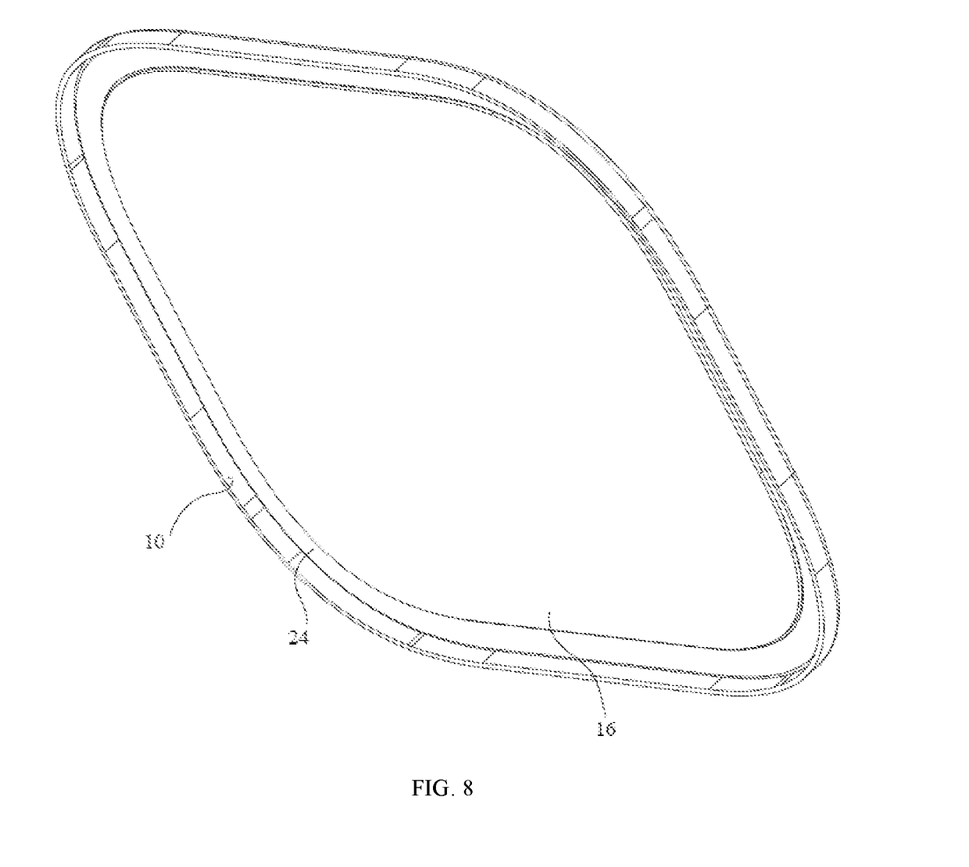
FIG. 8 is a perspective structural schematic view of an inner side of the screen protection assembly in FIG. 2.
Figure 9:
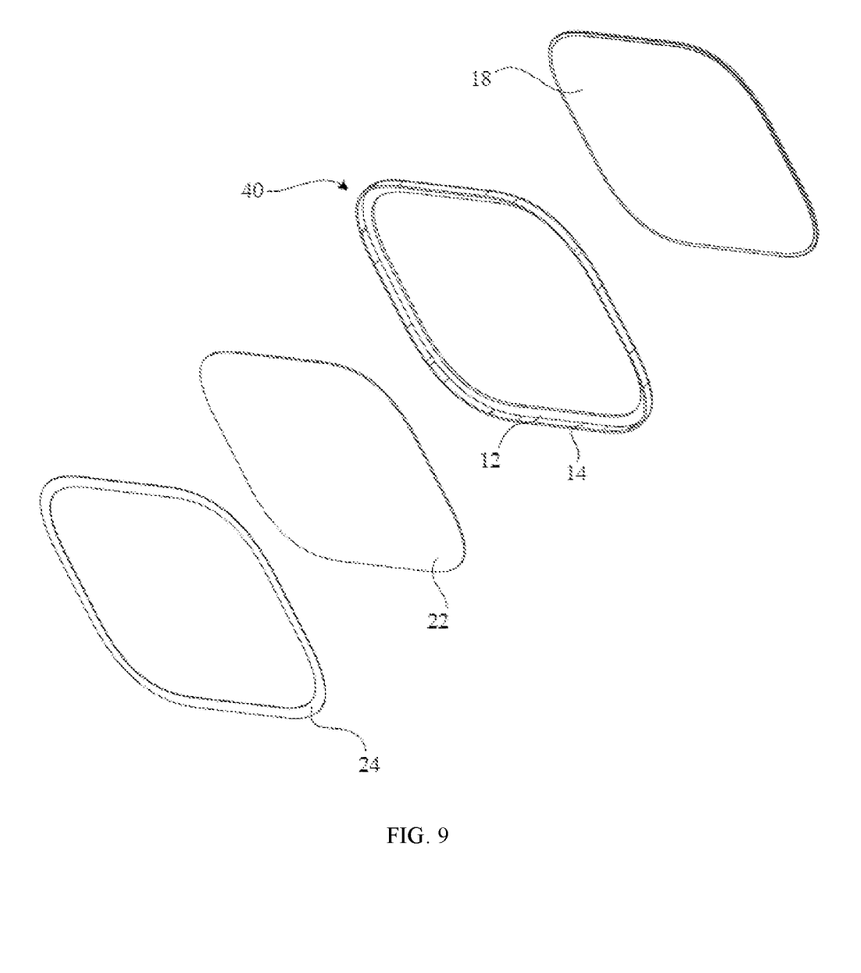
FIG. 9 is a schematic view of an exploded structure of the screen protection assembly in FIG. 2 at another viewing angle.

Further, referring to FIG. 6 together, an edge of the body layer 18 defines a step-shaped recess 20, and the annular light-shielding layer is disposed on a side of the step-shaped recess 20 facing the display screen 30 of the electronic device. In the embodiments, since the annular light-shielding layer is disposed in the step-shaped recess 20, the annular light-shielding layer can be prevented from elevating the double-sided adhesive layer 22 or the annular adhesive 24, thereby preventing the generation of deformations and gaps that affect the quality of the film application.

Further, a width of the annular adhesive 24 covered by the top wall 12 is greater than a width of the annular adhesive 24 covered by the body layer 18. In the embodiments, during assembly, the annular adhesive 24 may be connected to the protective frame 10 first, and since the width of the annular adhesive 24 covered by the top wall 12 is sufficiently large, the tolerance redundancy is large, such that the positioning is easier, which is conducive to improving the assembly efficiency. After the annular adhesive 24 is fixedly connected to the protective frame 10, the protective film 16 is then placed in the window defined by the protective frame 10, and finally the annular adhesive 24 and the edge of the body layer 18 are tightly pressed to fix the two, thereby preventing the protective film 16 from being detached from the protective frame 10. In order to further reduce the difficulty in fixing the annular adhesive 24 to the protective frame 10, the width of the annular adhesive 24 covered by the top wall 12 is greater than or equal to 5 times the width of the annular adhesive 24 covered by the body layer 18, and a spacing is formed between an outer edge of the annular adhesive 24 and an inner side of the side wall 14.

The present disclosure further proposes an electronic device including a main body 200; the main body 200 includes a display screen 30 and a bezel 40 disposed at an edge portion of the display screen 30; a front side of the display screen 30 is lower than a front side of the bezel 40; the electronic device further includes the screen protection assembly 100 as described above, where the double-sided adhesive layer 22 of the screen protection assembly 100 is bonded to the front side of the display screen 30, the protective frame 10 of the screen protection assembly 100 covers an outer side of the bezel 40. The specific structure of the screen protection assembly 100 is referred to in the above embodiments, and since the present electronic device is adopted with all of the technical solutions of all of the above embodiments, it likewise has all of the beneficial effects brought about by the technical solutions of the above embodiments, which will not be repeated herein. The main body 200 is a watch host or a mobile phone, the main body 200 may be a main body 200 of an electronic device with a screen such as a tablet computer, an electric paper book, etc., and the display screen 30 may be a touch screen or a simple display unit.

Finally, it should be noted that the above embodiments are only intended to illustrate the technical solutions of the present disclosure, not to limit them. Although the present disclosure has been described in detail with reference to the foregoing embodiments, those skilled in the art should understand that it is still possible to modify the technical solutions recorded in the foregoing embodiments, or to replace some of the technical features with the same ones; and these modifications or substitutions do not cause the essence of the technical solutions to depart from the spirit and scope of the technical solutions of the embodiments of the present disclosure.

What is claimed is:

1. A screen protection assembly, comprising: a protective frame, comprising a top wall and a side wall extending downwardly from an outer edge of the top wall; a protective film, disposed within a window defined by the top wall; wherein the protective film comprises a body layer and a double-sided adhesive layer, the double-sided adhesive layer being adhered to, bonded to, and fixed to an inner side of the body layer, and an edge portion of the body layer being exposed to the double-sided adhesive layer; and an annular adhesive, disposed on an inner side of the top wall and on a periphery of the double-sided adhesive layer; wherein the annular adhesive is bonded to and fixed to the inner side of the top wall and an inner side of the edge portion of the body layer; a thickness of the annular adhesive is less than a thickness of the double-sided adhesive layer, and a thickness difference between the annular adhesive and the double-sided adhesive layer is greater than or equal to a height difference between a front side of a display screen and a front side of a bezel of a main body of a corresponding electronic device.

2. The screen protection assembly according to claim 1, wherein a gap is formed between an outer edge of the double-sided adhesive layer and an inner edge of the annular adhesive.

3. The screen protection assembly according to claim 2, wherein the protective film further comprises an annular light-shielding layer disposed on the inner side of the edge portion of the body layer and obscuring the gap.

4. The screen protection assembly according to claim 3, wherein the annular light-shielding layer is a silkscreen ink.

5. The screen protection assembly according to claim 4, wherein the double-sided adhesive layer and/or the annular adhesive cover an inner side of the annular light-shielding layer.

6. The screen protection assembly according to claim 5, wherein an edge of the body layer defines a step-shaped recess, and the annular light-shielding layer is disposed on a side of the step-shaped recess facing the display screen of the corresponding electronic device.

7. The screen protection assembly according to claim 1, wherein a width of the annular adhesive covered by the top wall is greater than a width of the annular adhesive covered by the body layer.

8. The screen protection assembly according to claim 2, wherein a width of the annular adhesive covered by the top wall is greater than a width of the annular adhesive covered by the body layer.

9. The screen protection assembly according to claim 3, wherein a width of the annular adhesive covered by the top wall is greater than a width of the annular adhesive covered by the body layer.

10. The screen protection assembly according to claim 4, wherein a width of the annular adhesive covered by the top wall is greater than a width of the annular adhesive covered by the body layer.

11. The screen protection assembly according to claim 5, wherein a width of the annular adhesive covered by the top wall is greater than a width of the annular adhesive covered by the body layer.

12. The screen protection assembly according to claim 6, wherein a width of the annular adhesive covered by the top wall is greater than a width of the annular adhesive covered by the body layer.

13. The screen protection assembly according to claim 7, wherein the width of the annular adhesive covered by the top wall is greater than or equal to 5 times the width of the annular adhesive covered by the body layer, and a spacing is formed between an outer edge of the annular adhesive and an inner side of the side wall.

14. An electronic device, comprising a main body; wherein the main body comprises a display screen and a bezel disposed at an edge portion of the display screen; a front side of the display screen is lower than a front side of the bezel; the electronic device further comprises the screen protection assembly according to claim 1, wherein the double-sided adhesive layer of the screen protection assembly is bonded to the front side of the display screen, and the protective frame of the screen protection assembly covers an outer side of the bezel.

15. An electronic device, comprising a main body; wherein the main body comprises a display screen and a bezel disposed at an edge portion of the display screen; a front side of the display screen is lower than a front side of the bezel; the electronic device further comprises the screen protection assembly according to claim 2, wherein the double-sided adhesive layer of the screen protection assembly is bonded to the front side of the display screen, and the protective frame of the screen protection assembly covers an outer side of the bezel.

16. An electronic device, comprising a main body; wherein the main body comprises a display screen and a bezel disposed at an edge portion of the display screen; a front side of the display screen is lower than a front side of the bezel; the electronic device further comprises the screen protection assembly according to claim 3, wherein the double-sided adhesive layer of the screen protection assembly is bonded to the front side of the display screen, and the protective frame of the screen protection assembly covers an outer side of the bezel.

17. An electronic device, comprising a main body; wherein the main body comprises a display screen and a bezel disposed at an edge portion of the display screen; a front side of the display screen is lower than a front side of the bezel; the electronic device further comprises the screen protection assembly according to claim 4, wherein the double-sided adhesive layer of the screen protection assembly is bonded to the front side of the display screen, and the protective frame of the screen protection assembly covers an outer side of the bezel.

18. An electronic device, comprising a main body; wherein the main body comprises a display screen and a bezel disposed at an edge portion of the display screen; a front side of the display screen is lower than a front side of the bezel; the electronic device further comprises the screen protection assembly according to claim 5, wherein the double-sided adhesive layer of the screen protection assembly is bonded to the front side of the display screen, and the protective frame of the screen protection assembly covers an outer side of the bezel.

19. An electronic device, comprising a main body; wherein the main body comprises a display screen and a bezel disposed at an edge portion of the display screen; a front side of the display screen is lower than a front side of the bezel; the electronic device further comprises the screen protection assembly according to claim 6, wherein the double-sided adhesive layer of the screen protection assembly is bonded to the front side of the display screen, and the protective frame of the screen protection assembly covers an outer side of the bezel.

20. The electronic device according to claim 1, wherein the main body is a watch host or a mobile phone.

* * * * *